(12) United States Patent
Mccoo et al.

(10) Patent No.: US 7,840,923 B2
(45) Date of Patent: Nov. 23, 2010

(54) METHODS AND APPARATUSES FOR DESIGNING INTEGRATED CIRCUITS USING VIRTUAL CELLS

(75) Inventors: Miles F. Mccoo, Portland, OR (US); Michael Bin, Kiryat Motzkin (IL); Ran Levy, Ramat-Gan (IL); Ziv Frizus, Pardes Hana (IL)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 11/904,161

(22) Filed: Sep. 26, 2007

(65) Prior Publication Data

US 2009/0083681 A1    Mar. 26, 2009

(51) Int. Cl.
  *G06F 17/50*    (2006.01)
(52) U.S. Cl. ............... 716/6; 716/1; 716/2; 716/17
(58) Field of Classification Search ............... 716/1, 716/2, 6, 17
See application file for complete search history.

(56) References Cited

U.S. PATENT DOCUMENTS 6,286,128 B1 *    9/2001    Pileggi et al. ............... 716/18

* cited by examiner

*Primary Examiner*—Thuan Do
(74) *Attorney, Agent, or Firm*—Schubert Law Group PLLC; Garland D. Charpiot (57) ABSTRACT

Methods and apparatuses for analyzing and/or designing integrated circuits using virtual transparent cells disclosed. Some embodiments comprise calculating model values for virtual transparent cells or elements of an integrated circuit design varying a transparency variable in modeling equations, and allowing replacement of the cell with a wire based upon the calculations. Varying the value of the transparency value for the calculations may allow the virtual transparent cells to be continuously modeled between a wire and a conventional version of the cell. Some embodiments may comprise a cell library with one or more modeling formulas for one or more virtual transparent cells and a response module to calculate different model values of the modeling formulas.

14 Claims, 4 Drawing Sheets

METHODS AND APPARATUSES FOR DESIGNING INTEGRATED CIRCUITS USING VIRTUAL CELLS

FIELD

The embodiments herein generally relate to the field of integrated circuit devices. More particularly, the embodiments relate to methods, apparatuses, and software for analyzing or designing integrated circuits using virtual transparent cells.

BACKGROUND

As manufacturers have implemented more and more circuit elements in smaller and smaller silicon substrate surface areas, engineers and designers developed hardware and software tools to automate much of the integrated circuit design and manufacturing process. While there are several approaches to developing integrated circuits, a primary method today uses standard cells in the development process. The complexity of standard cells can range from simple logic gates, such as those found in gate arrays, to block-level components such as random access memories (RAMs), read only memories (ROMs), and programmable logic arrays (PLAs).

Once a designer arranges the different circuits and function blocks in schematic form for an electronic circuit, signals often need to be transmitted between different circuit blocks. Sometimes, the signals must be transmitted relatively long distances, such as half way across a physical chip die. A series of computer-aided design tools generate a net list of standard cells and the interconnections between the cells. A floor planner or placement tool uses the net list to place the standard cells at specific locations in an integrated circuit layout pattern. After generating this layout pattern, software tools, called routers, determine the physical locations of conducting paths between the cells.

Designers must frequently focus on timing requirements of the integrated circuit elements before, during, and after placing the elements and selecting the routes of the interconnections. To address the timing constraints, designers may use one or more electronic design automation (EDA) tools to perform timing analyses on the integrated circuit designs. Based on the physical layout, the software tools may determine when signals arrive too early or too late at the ends of timing paths, which may affect the sequential logic or other logic at the ends of the timing paths. To address the timing issues, designers may move or resize circuit elements in timing paths, delete or insert buffers, restructure logic of one or several of the circuits, or re-synthesize the integrated circuit design. These activities, such as activities involving the placement of inserting/removing/resizing buffers, can be among the most challenging and time consuming in the design process, since many of the activities require extensive human intervention with limited automation.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

The following is a detailed description of embodiments depicted in the accompanying drawings. The specification is in such detail as to clearly communicate the embodiments. However, the amount of detail offered is not intended to limit the anticipated variations of embodiments; but on the contrary, the intention is to cover all modifications, equivalents, and alternatives consistent with the spirit and scope of the embodiments as defined by the appended claims.

Portions of the following detailed discussion describe many embodiments using only buffers. One of ordinary skill in the art will recognize that other types of circuit elements may be substituted for the described elements when employed in accordance with similar constraints to perform substantially equivalent functions. For example, one or more embodiments may substitute inverters or different types of logic gates instead of buffers.

Figure 1A:
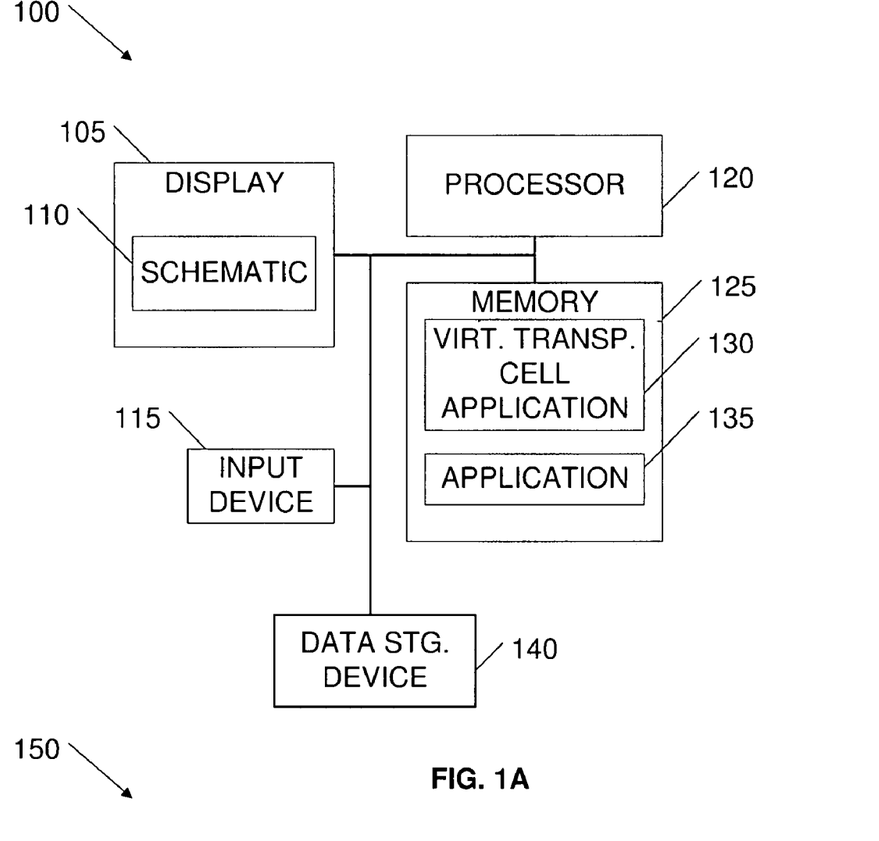
FIG. 1A depicts a system that may be used to design an integrated circuit using virtual cells.

Turning now to the drawings, FIG. 1 illustrates a system 100 that may use virtual transparent cells when designing an integrated circuit, such as an application specific integrated circuit (ASIC) or a microprocessor. System 100 has a processor 120 coupled to a display 105 and memory 125. System 100 may comprise, as examples, part of a desktop computer, a server platform, a notebook computer, or a supercomputer running one or more EDA software programs. For example, application 135 may comprise Verilog, a floor planning application, a logic synthesis application, or a circuit simulator. EDA may refer to computer-aided engineering, computer-aided design, and/or computer-aided manufacturing of electronics and integrated circuits (ICs) in various embodiments.

Depending on the embodiment, the type of processor used in a system may vary. As examples, in one embodiment processor 120 may comprise a single core reduced instruction set computer (RISC) processor, while in another embodiment processor 120 may comprise a multiple-core, out-of-order complex instruction set computer (CISC) processor. Likewise, the type of memory used in an embodiment may vary from one embodiment to the next. For example, memory 125 may comprise dynamic random access memory (DRAM), static random access memory (SRAM), or both DRAM and SRAM in various embodiments, such as with cache memory and so-called "main" system memory.

When used by an integrated circuit designer, the processor of a system may execute instructions of several EDA applications in memory, wherein some of the instructions will relate to modeling or simulating virtual cells. For example, processor 120 may execute instructions of a virtual transparent cell application 135, which may comprise one of many different EDA applications, such as a floor planning application. Processor 120 may execute instructions of virtual transparent cell application 130, allowing the designer to arrange cells and pre-defined circuit blocks from a cell library, such as cell library 160, into one or more schematics, such as schematic 110. For example, virtual transparent cell application 130 may comprise software modules that work together to perform static timing analyses of ICs. To perform the static timing analyses, virtual transparent cell application 130 may execute various instructions of different software routines. In one or more embodiments, the different software routines may be contained in different modules, such as the modules of apparatus 150 depicted in FIG. 1B.

Figure 1B:
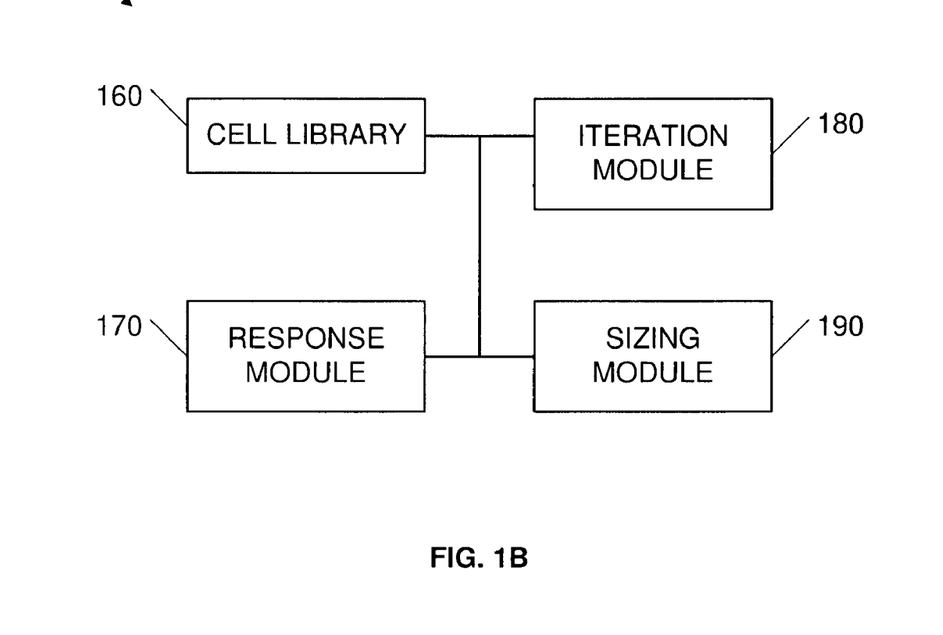
FIG. 1B depicts an apparatus that may perform static timing analyses and cell placement and routing optimization routines when designing an integrated circuit.

In some embodiments, the modules of apparatus 150 may comprise software routines stored in a machine-accessible medium of a system like system 100, such as in memory or on a platter of a hard drive of the system. In alternative embodiments, one or more of the modules may comprise hardware, such as logic circuits and state machines. For example, iteration module 180 may comprise a high-speed logic circuit arranged calculate modeling formulas in a rapid fashion.

Processor 120 may execute instructions of virtual transparent cell application 130 and an operating system of system 100 in order to display a graphic representation of schematic 110 on display 105. In different embodiments, the type of display device may comprise a CRT monitor, a liquid crystal display (LCD) screen, or a thin-film transistor flat panel monitor, as examples.

To insert, change, and delete the cells and circuit elements, the designer may utilize some type of input device, such as input device 115. In some embodiments, the input device may comprise a keyboard. In other embodiments input device may comprise another type of input device, such as a stylus and a touch-screen or some type of stylus-sensing tablet. The designer may use input device 115 to insert virtual transparent cells into the schematic 110, to move or place the virtual transparent cells at different electrical and physical locations in schematic 110, to enter sizing parameters of the virtual transparent cells, and to remove one or more of the virtual transparent cells from the design altogether.

Upon creating, modifying, and optimizing the integrated circuit design, the designer may save the design to some type of storage device. For example, system 100 may store the design, which may take the form of some type of "net list", to data storage device 140. The type of the data storage device may vary from embodiment to embodiment. In one embodiment, data storage device 140 may comprise a hard drive, a compact disc (CD) or digital versatile disc (DVD) drive, or another type of storage device such as a flash memory "thumb" drive.

Depending on the embodiment, the system may contain other components not shown in FIG. 1. For example, in an alternative embodiment system 100 may also have a communication device, such as a hardware or wireless communication device. System 100 may send or receive the IC design net list file(s) over the Internet, as well as other EDA-related simulation information, such as cell modeling databases, virtual transparent cell models, etc. Aside from sending and/or receiving the net list file(s), the communication device may be used for other purposes. For example one or more EDA applications may run on system 400 to optimize the IC design, while other EDA applications on other systems may also run to simulate and/or optimize the IC design, which may be necessary when very precise modeling results are desired which require extensive processor-intensive calculations, such as a detailed simulation for the operation of the IC design that has virtual transparent cells.

System 100 may allow a designer to perform numerous design tasks, some of which will involve inserting, modeling, analyzing, sizing, and removing elements of the IC design, which may include virtual transparent cells. For example, a designer may use virtual transparent cells when inserting buffers, sizing devices, and sizing wires or conductive paths during the initial design stages. Virtual transparent cells may be used during intermediate activities of the design process, such as performance-driven global routing, interconnect optimization, timing driven element placement, and delay budget analysis. The design process may then enter the final design stages, such as detailed routing and variable width/spacing design phases. Designers and/or EDA tools may employ virtual transparent cells during these final design phases as well.

Repeater or buffer insertion may be an effective technique to reduce the interconnect delay. Additionally, repeaters may be used to solve other design constraints, such as fan-out, or increasing signal delay problems for hold and setup time violations. Good planning of the buffer positions, size, and placement may depend on good modeling and timing analysis tools. The modeling of cells, including virtual transparent cells may be accomplished in a variety of different ways in different embodiments.

To model an interconnect cell element, such as wire or conductive path elements to be coupled with a buffer or an inverter, one may take into consideration the resistive and capacitive characteristics of the wire and device under consideration. In order to consider both wire resistance and capacitance and model the distributive nature of interconnects, a routing tree may be modeled as a resistor-capacitor (RC) tree by dividing each long wire into a sequence of wire segments and modeling each wire segment as a $\pi$-type RC circuit. One method of approximation that is fairly common is what is referred to as an Elmore delay approximation. The Elmore delay is a relatively simple technique used to approximate signal propagation delay through an RC network. For tree networks, the Elmore technique may approximate delay through each segment by multiplying the resistance of a segment by the downstream capacitance. One may then approximate delay through the network by calculating the sum of the delays from a root, or source, to a destination, or sink.

Unfortunately, since the Elmore delay is a rough approximation, the absolute value of the Elmore delay may not provide sufficient accuracy in some embodiments. One more accurate method, referred to as the asymptotic waveform evaluation (AWE) method, uses higher order moments to calculate a reduced-order approximation model. The application of AWE may vary, depending on numerous factors and preferences of the designer and EDA tool(s) being used, and can often time be very complex. Fortunately, one skilled in the art will already have a sufficient working knowledge and a thorough understanding of AWE will therefore not be necessary to understand how virtual transparent cells may be modeled using AWE.

Figure 2A:
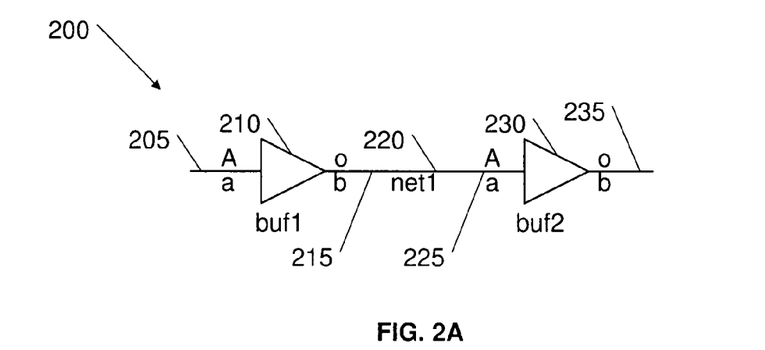
FIG. 2A illustrates how characterization models may be developed for a pair of virtual transparent buffers.

Now that the background for the Elmore delay and AWE has been presented, a few models using these methods will now be illustrated in greater detail. FIG. 2A illustrates how characterization models may be developed for a chain of virtual transparent buffers 200. FIG. 2A depicts a first virtual buffer 210, which may, for the sake of convenience and understanding, be referred to as "buf1" in the modeling equations. Buffer 210 has an input 205 and an output 215. A signal of varying magnitude present at either input 205 or output 215 may be referred to as "buf1% a" or "buf1% o", respectively, in the modeling equations. Output 215 couples with an input 225 of a second virtual buffer 230, wherein the junction of the two comprises an intermediate node 220. In the modeling equations, intermediate node 220 may be referred to as "net1", input 225 referred to as "buf2% a", buffer 230 as "buf2", and output 235 referred to as "buf2% o".

Buffer 210 or buffer 230 may comprise a cell that may be placed by a designer when designing an integrated circuit. For example, during a floor planning stage a designer may wish to connect two separate circuits of the IC design, such as circuit 260 and circuit 280 shown in FIG. 2C, using one or more interconnecting cells. Since the design of the IC is at a relatively early stage in the IC design process, the designer may not know beforehand the size and/or number of elements to use when coupling the two circuits. Based on experience, the designer may try inserting a certain number of buffers, such as virtual buffers 200, between the two circuits (virtual transparent cells 270). After running one or more EDA modeling, timing analysis, or optimization tools on virtual transparent cells 270, the EDA system may conclude that both buffers, only one buffer, or no buffers are necessary to couple circuit 260 with circuit 280. However, since the cells being inserted may comprise virtual transparent buffers, the designer may instead opt to insert a more complex preliminary arrangement of buffers, such as virtual buffer arrangement 240 shown in FIG. 2B. Although the number of buffer elements in the virtual buffer arrangement 240 may be excessive, an embodiment may be able to statically analyze the delay and signal propagation of the individual virtual buffers of the virtual buffer arrangement 240 and propose a suitable arrangement of buffers to be included in the recommended final design. That is to say, EDA analysis/optimization software may be able to utilize the features afforded by the virtual transparent cells and iteratively evaluate different sizes and combinations of series and parallel-connected buffers.

Figure 2B:
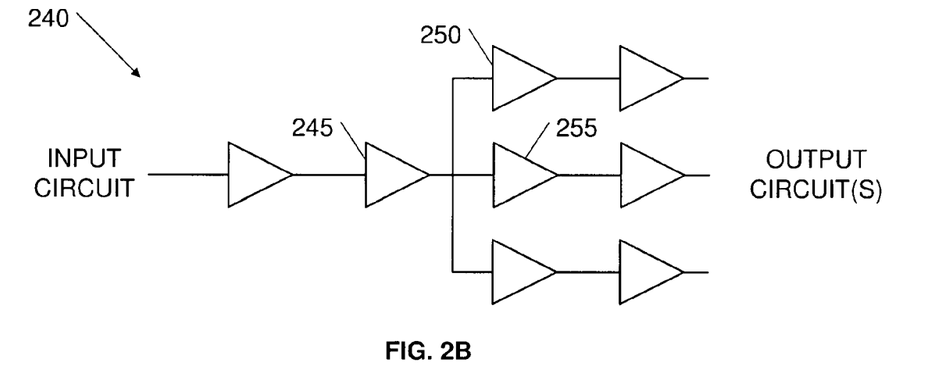
FIG. 2B depicts a tree network of cells that may serve as a buffer interconnect insertion when designing an integrated circuit.
Figure 2C:
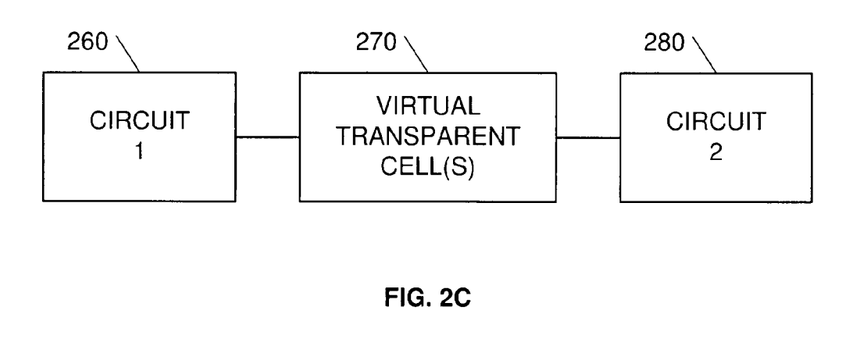
FIG. 2C illustrates how a virtually transparent cell, or virtual transparent cells, may couple two circuits in an integrated circuit.

Upon completing the analyses/optimization, the EDA software may propose an optimum or recommend arrangement showing only the necessary elements. For example, after providing the constraints for input circuit 260 and output circuit 280, running the EDA analysis/optimization software may reduce the number of recommended or final number of buffers from virtual buffer arrangement 240 to only three buffers, such as buffer 245, buffer 250, and buffer 255, and provide information from the analysis/optimization steps in order for the designer or other EDA software to select appropriate size elements for buffers 245, 250, and 255.

To understand how the EDA software may use virtual transparent cells during several analysis and optimization phases, such as during a static timing analysis, we focus on how the EDA software may model a virtual transparent cell, in at least one embodiment. A virtual transparent cell timing model may be used to model a conventional circuit cell as a special case of a wire. In other words, the software may allow the circuit cell to continually vary between "part wire, part cell" states. For example, virtually transparent cells may be conceptualized as regular circuit cells, but have a "transparency" characteristic or transparency level that varies from 0% to 100%. For example, at 0% the cell may have characteristics of a wire and at 100% have the characteristics of a regular cell. A specific example may be a virtual buffer. At 0%, the virtual buffer cell may be modeled as a wire and have zero delay due to buffering. At 100%, the virtual buffer cell may be modeled as a normal (non-virtual) buffer and have a delay according to the buffer size, characteristics, etc. Using transparent virtual cells for circuit analyse, may allow the EDA software to continuously model between a wire and a cell.

For the purpose of calculating delays of cells and components, such as wires and buffers, EDA software may model the components as RC circuits. The EDA software may allow the cell to be in a "part wire, part cell" state that varies according to a percentage variable, wherein only part of the downstream loading is reflected back to the driver based on the percentage variable and only part of the cell delay is included in the calculation based on the percentage. When modeling a gate or cell as a switch-level RC circuit, the model may comprise an effective linear resistance driven by a voltage source which may be activated or respond to a step-input or ramp-input. The effective resistance of a cell may depend on the transition time of the input signal, the loading capacitance, and the size of the cell. For example, in one embodiment EDA software may use a fixed resistance value to model the cell by selecting an appropriate capacitive load and matching a certain percentage of the cell driving the load with that of the equivalent RC circuit under the step-input.

To illustrate how, in one or more embodiments, EDA software may model one specific instance of a virtual transparent cell and calculate such model values or responses as delay and slope, we can describe sets of modeling formulas by referring back to the chain of virtual transparent buffers 200. For example, the modeling formulas may be stored in a cell library containing virtual transparent cells. The term "Vbuffer" may be used to refer to a virtual transparent buffer, such as buffer 210. The transparency variable may vary from 0% to 100%, which may be represented as a decimal multiplier from 0.0 to 1.0 in the modeling formulas. When the transparency variable equals zero, the virtual transparent buffer may respond equivalently to a wire, with zero delay. Conversely, when the transparency variable is equal to 1.0, the virtual transparent buffer may respond in a manner equivalent to a conventional buffer having full buffer delay.

Continuing with definitions for the virtual cells, we may set up a system of notation for cells that have an input pin "a" and an output pin "b". The delay between a pin a and pin b when the cell is not transparent may be designated by the notation "delay (a,b)", whereas "Vdelay (a,b)" may represent the delay between pin a and b when the cell exhibits some amount of virtual transparency. The notation for capacitance may be represented in a similar fashion. The effective capacitance as seen by an output driver coupled to pin a may be represented as "Ceff (a)", the internal capacitance of the cell at pin a as "Cint(a)". Whenever the cell has some amount of virtual transparency, the capacitance for pin a of a cell may be represented by "VCint (a)". "Slope (o)" may represent the slope for pin a when the cell has no virtual transparency and "VSlope (o)" the slope on pin a when taking the virtual transparency characteristics of the cell into account. The lumped resistance of intermediate node 220 (net1) may be represented by "LocalRes (net1)". Simiarly, the lumped capacitance of intermediate node 220 may be represented by "LocalCap (net1)".

For the sakes of explanation and illustration, modeling formulas for at least one embodiment will be described for buffers 200 of FIG. 2A. Similar formulas and equations may be developed for other types of cells, such as inverters. Also, for the sake of understanding, two sets of models will be given for some instances of the modeling equations. In some of the instances, modeling of the virtual cells will first be discussed using an Elmore model. The Elmore models are included so that one may better understand the concepts of how the cells are modeled, since the Elmore delay concept may be more readily understood by those skilled in the art. However, in many instances the accuracies provided by the Elmore models may be insufficient. To provide more accurate models, AWE models will also be presented.

Vbuffer Ceff Model

Referring to FIG. 2A, effective capacitance of virtual buffer 230 may be modeled as: VCint(buf2% a)=Cint (abuf2% a)*Percent(buf2)+Ceff(buf2% o)*(1−Percent (buf2)). In other words, the capacitance seen at the input pin to virtual buffer 230, represented by "Vint (buf2% a)" in the forumula, may be equal to the product of the internal capacitance for the input of virtual buffer 230, represented by Cint (buf2% a), and the transparency percentage value assigned to virtual buffer 230, Percent(buf2), plus the product of the effective capacitance seen at the output pin of virtual buffer 230, Ceff(buf2% o), and the remaining portion of the cell which is not being modeled as a virtual cell (1−Percent (buf2)). While the formula has been presented for virtual buffer 230 (buf2), the formula may also be applied to virtual buffer 210 (buf1) by substituting the appropriate terms.

As for modeling the effective capacitance for an output of one of the buffers, we first look at an Elmore approach. Using an Elmore model, the effective capacitance for output 215 for virtual buffer 210 may be modeled as: Ceff(buf1% o)=Cint (buf1% o)+LocalCap(net1)+VCeff(buf2% a). That is to say, the effective capacitance seen at the output of virtual buffer 210 may be equal to the internal capacitance for the output of virtual buffer 210 plus the product of the lumped capacitance of intermediate node 220 and the effective capacitance seen at the input of virtual buffer 230.

For an AWE approach, the effective capacitance may be found by running an AWE stage simulation using the effective capacitance seen at the input of virtual buffer 230, in other words VCeff(buf2% a), and the default slope at the input of virtual buffer 210 (buf1% a). The effective capacitance for the output of virtual buffer 210 (VCeff(buf1% o)) may then be taken from the results of the stage simulation.

Vbuffer Delay and Slope Model

Continuing to refer to FIG. 2A, the delay and slope models may be modeled using the Elmore model for illustration, and using AWE for greater accuracy. In calculating slope and delay using the Elmore modeling approach, one may use the following sets of equations:

VDelay(buf1% a, buf1% o)=Delay(buf1% a, buf1% o)*Percent(buf1)

VDelay(buf1% o, buf2% a)=LocalRes(net1)*(0.5*LocalCap(net1)+VCeff(buf2% a))

VSlope(buf1% o)=Slope(buf1% o)*Percent(buf1)+ VSlope(buf1% a)*(1−Percent(buf1))

VSlope(buf2% a)=0.5*VSlope(buf1% o)+0.5*(LocalRes(net1)*(0.5*LocalCap(net1)+VCeff(buf2% a))

In calculating slope and delay using the AWE modeling, one may use the following approach:

AWE may be simulated for the chain of virtual transparent buffers 200 using VCeff (buf2% a) and VSlope (buf1% a). One may use a relative arc override in order to scale the driver results.

Delay Scale(buf1)=Percent(buf1)

Delay Offset(buf1)=0

Slope Scale(buf1)=Percent(buf1)

Slope Offset(buf1)=VSlope(buf1% a)*(1−Percent (buf1))

Special Types of Vbuffer

In the various modeling formulas, the "Percent" (also referred to as % or % p in some instances) may be varied to adjust the transparency value for each of the virtually transparent cells. In two instances, which may be the boundary conditions in many embodiments, the virtual buffers may have specific attributes. One special case may be when the Percent equals 0.0 (0%), in which case the virtual buffer may be modeled as a wire. Another special case may be when the Percent equals 1.0 (100%), in which case the virtual buffer may be modeled as a regular or conventional buffer. In other words, when P=1.0, the virtual cell may be modeled using its conventional modeling formulas.

The concept of virtually transparent buffers or alternatively other types of virtually transparent cells, using the above modeling formulas above, may provide the basis for new algorithms that are implemented in EDA software optimization tools. For example, simulation and/or modeling information for virtual transparent cells may be stored in a cell library, such as cell library 160 shown in FIG. 1B, which a designer may use when treating the schematic representation or net list for the IC design. The cell library may contain varying amounts of modeling information, in different embodiments. In one embodiment, the cell library may contain shape information for visual schematic representation of cells on a display, electrical characteristic values, and modeling formulas for numerous virtual transparent cells. In another embodiment, the cell library may comprise only the modeling formula for a virtual transparent cell.

During static timing analyses and optimization phases of design, the EDA software may calculate response or model values for elements of cells based on the transparency percentage values. For example, the software may execute instructions of a response module like response module 170. The software may calculate the response values for the virtual transparent cells, as well as other cells, in many cycles or iterations using a module such as iteration module 180. At the conclusion of one or more of the timing analyses or optimization phases, the EDA software may use the information of the model analyses to select sizes of elements or cells to be included in the final design. For example, the EDA software may execute routines stored in sizing module 190 to eliminate certain repeaters from the preliminary IC design, as well as insert and set sizes for repeaters in various locations of the circuit based on the modeling.

Such new optimization tools or EDA software may be employed by the designers of integrated circuits to improve the performance and/or timing of the designs for the integrated circuits. More specifically, the concept of virtually transparent cells, such as virtually transparent buffers, may allow continuous modeling between a wire and a cell. Virtual cells may allow optimization tools and timing tools instant and continuous switching between wires and cells in the design. In other words, the optimization and timing tools are no longer limited to selecting between only two choices, either a buffer or no buffer, but can perform static timing analyses and other analyses using elements which have characteristics of both a wire and a conventional cell.

Figure 3:
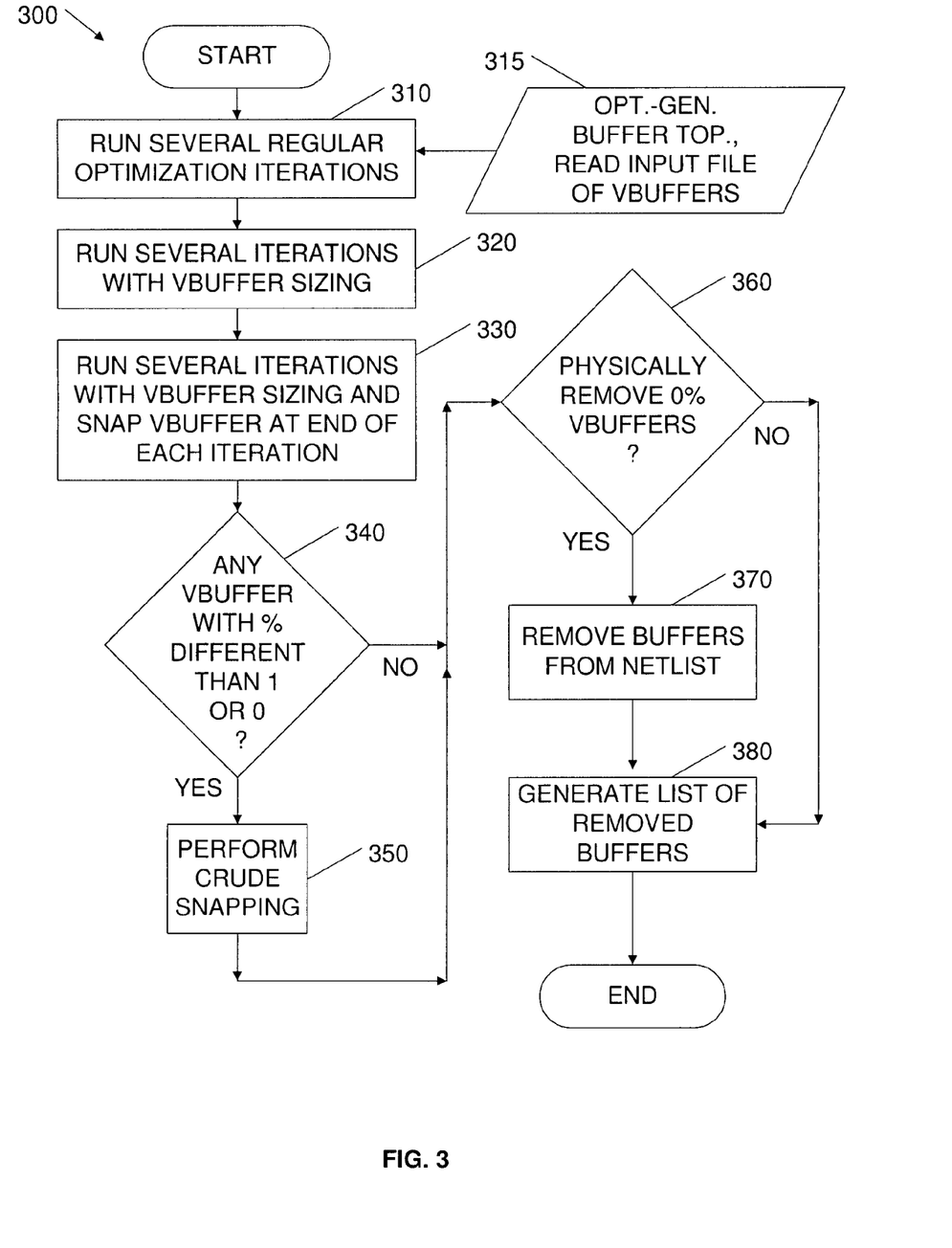
FIG. 3 illustrates an algorithm that may be used to size and eliminate buffers during a circuit optimization routine.

To illustrate in how EDA software may use the concept of virtual transparent cells to improve power and timing of integrated circuit designs, we turn to FIG. 3. FIG. 3 illustrates an algorithm that may be used in at least one embodiment to size and eliminate buffers during a circuit optimization routine. The algorithm may use virtual transparent cells to either size or eliminate buffers during a circuit optimization phase of design, such as when running global optimization software.

Flowchart 300 of the virtual transparent algorithm depicted in FIG. 3 starts by first running several regular iterations of the optimization tool (element 310). For example, the algorithm may first perform basic or preliminary optimization without modeling or taking into account virtual buffers. As a preface to running the preliminary optimization (element 310), some embodiments may optionally generate the buffer topology, determining which buffers are virtual buffer candidates for removal, by using an input file (element 315). For example, the EDA software may first import information for from a net list file, wherein the net list file includes Vbuffers which may be candidates for insertion and/or removal.

The algorithm may continue by running several iterations where the transparency level for the Vbuffers may be changed by the circuit optimizer (element 320). For example, a specific Vbuffer may be assigned a specific size with 40% transparency. In other words, the the EDA software may treat the buffer as having 40% of the characteristics of wire and 60% of the characteristics of a buffer. The designer may run the iterative circuit optimizer to find spots with the biggest delays, determine which buffers may be removed, etc. Depending on how the different sections of the integrated circuit design respond, the designer may choose to focus on optimizing certain circuits, such as those circuits that respond well to initial tweaking.

In various embodiments, the algorithm may adjust the transparency level using a variety of different techniques. For example, in one embodiment the algorithm may adjust the transparency levels of numerous Vbuffers using Lagrangian relaxation, which is a technique for solving constrained optimization problems. The algorithm may run several iterations while varying the value of the transparency settings for the Vbuffers and snap Vbuffers that are close to 0% or 100% (element 330). In other words, the software may vary the percentage variable for the individual virtual buffers under consideration, in which each percentage value for each Vbuffer may change at the same time as other Vbuffers or each percentage value may change independently from the other percentage values for other Vbuffers. That is to say, the EDA optimization software may set the percentage values of individual Vbuffers separately from other Vbuffers during the optimization process. After running each iteration, the software may find Vbuffers that are equal to boundary values of 0% and 100%, and perform automatic snapping.

The algorithm may then make some decisions regarding Vbuffers that do not solve to percentage values equaling 0% or 100% (element 340). If a Vbuffer transparency variable percentage is lower than a predetermined low boundary value, such as 20%, the software may set the Vbuffer percentage equal to zero and run additional iterations. Similarly, for a Vbuffer percentage that is greater than a high boundary value, such as 80%, the software may set the Vbuffer percentage equal to 100%, or 1.0. An embodiment may lock the percentage value once snapping has occurred for a particular Vbuffer.

The algorithm may then perform crude snapping (element 350). For example, if a Vbuffer percentage value is greater than or equal to some crude point, such as 50%, then the software may snap the Vbuffer percentage for that Vbuffer equal to 100% (1.0). Conversely, if a Vbuffer percentage value is less than the crude point then the software may snap the Vbuffer percentage for the Vbuffer equal to zero (0.0).

Upon snapping the percentage values, both for percentages that are close to the boundary values and for the crude snapping, the software algorithm may then physically remove the Vbuffers with percentage values equaling 0% (elements 360 and 370). For example, for a Vbuffer that the software has optimized the percentage value to 0%, the software may remove the Vbuffer from the netlist or circuit design. Similarly, for a Vbuffer that the software has optimized the percentage value to 100%, the software may edit the net list and change the element from a Vbuffer to a regular or conventional buffer, having no transparency characteristics. At this time, in an alternative embodiment, the software may select a size of the buffer based on results from the optimization iterations. For example, the software may select different size buffers depending on the magnitude of the percentage value at the time snapping occurred.

The algorithm may conclude by generating a list of removed repeaters (element 380). For example, other software tools or optimization routines of a suite of EDA programs may use this information in their routines, such as to make changes to elements coupled to the removed repeaters. An algorithm, such as the algorithm of flowchart 300, which integrates virtual buffer or virtual repeater elimination may improve the results in the global optimization software. When combined with place-and-route software, the routing tool may place large amounts of virtual buffer candidates and the optimization tool may choose the optimal combinations of buffers for the final design. In other words, the new algorithm may extend the scope of a global optimization tool. When combined with a prior stage that inserts large amounts of candidate buffers, the virtual transparent buffer algorithm may extend the global optimization algorithm to control the placement of the buffers in context of the global optimization cost function and constraints, in order to reduce overall implementation costs.

Figure 4:
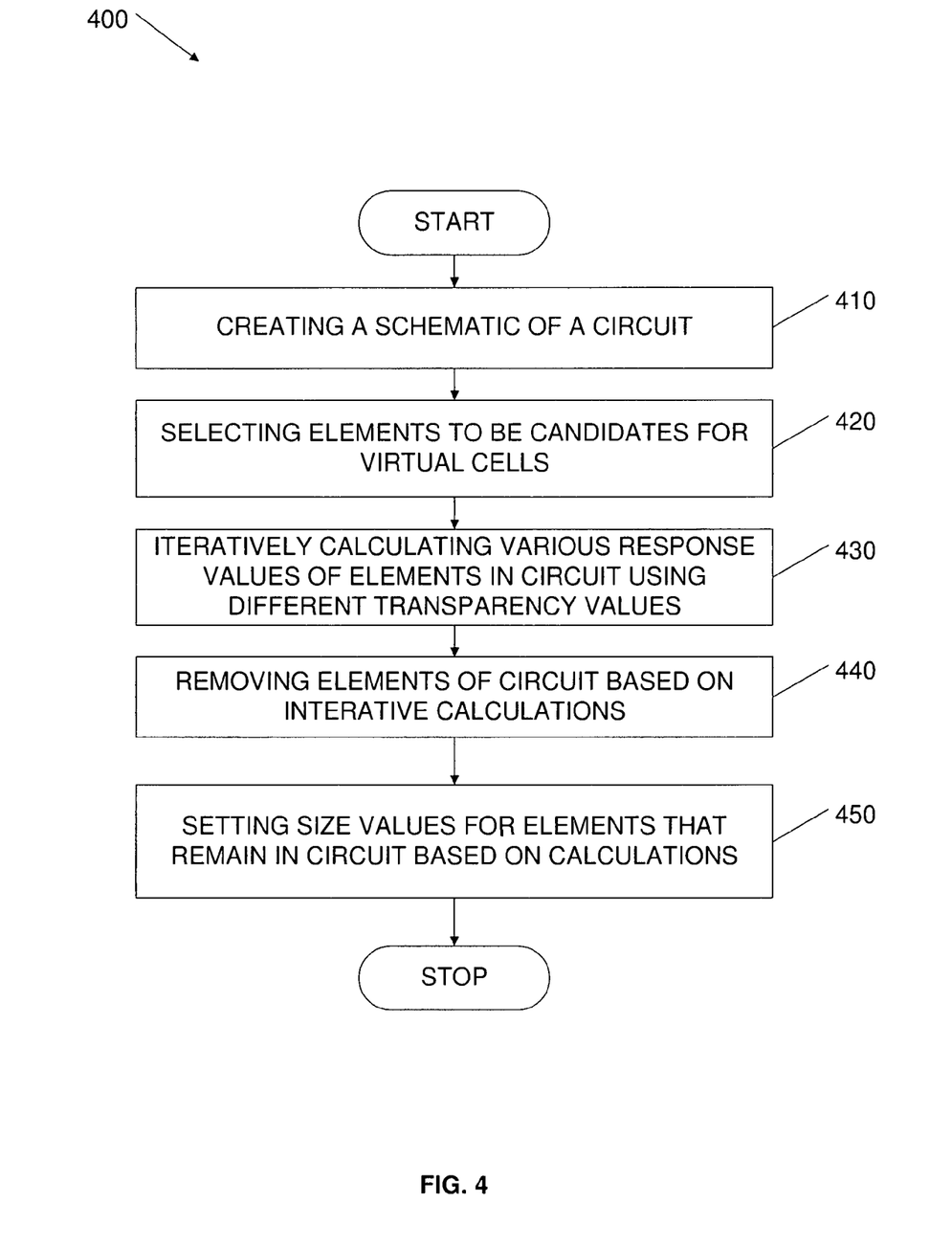
FIG. 4 illustrates a method of sizing and optimizing buffers in an integrated circuit design.

FIG. 4 depicts a flowchart 400 illustrating a method of sizing and optimizing buffers in an integrated circuit design. Flowchart 400 begins with creating a schematic of a circuit (element 410). For example, a designer may use EDA software to arrange logic blocks, function blocks, memory, programmable gate arrays, etc., stored in cell library 160 to form a preliminary integrated circuit design for an ASIC. An embodiment according to flowchart 400 may continue by selecting elements to be candidates for virtual cells (element 420). For example, a designer may evaluate the integrated circuit design and designate certain buffers or repeaters as candidates for removal, to have an optimization routine determine which elements may be removed.

An embodiment according to flowchart 400 may continue by iteratively calculating various model values or response values of elements in the integrated circuit using different transparency values (element 430). For example, EDA software may perform static timing analyses using the AWE models for virtual buffers inserted into an integrated circuit design using routines of response module 170 and iteration module 180. In other words, the software may iteratively choose certain values for the transparency percentage variables in the modeling formulas to calculate response values for the values of VCeff, VDelay, Delay Scale, Delay Offset, etc. An embodiment according to flowchart 400 may continue by removing elements of the integrated circuit based on the iterative calculations (element 440). Continuing with our previous example, the EDA software may have run through many iterations and selected transparency values of 0% for some Vbuffers, whereupon the software may remove those items from the net list and replace them with wires using sizing module 190.

The method of flowchart 400 may then set the size values for elements that remain in the circuit based on the calculations (element 450). Again continuing with our previous example, the EDA software may have run through the numerous iterations and selected transparency values of 100% for some Vbuffers, whereupon the software may replace those virtual buffers with conventional buffers in the net list. The software may select different sizes of buffers based on the data or results of the iterative calculations, such as the transparency percentage value at the time the buffer was snapped, using sizing module 190.

One embodiment of the invention may be implemented as a program product for use with design system to create an integrated circuit, such as a microcontroller or a microprocessor integrated circuit. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media; when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the embodiments herein contemplate methods and apparatuses for processing I/O requests for data storage devices. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. An apparatus to design a circuit, comprising:
    a cell module comprising modeling information for a buffer cell, wherein the modeling information comprises a variable which enables the buffer cell to be modeled with varying amounts of capacitance based on the value of the variable, wherein further the variable may be set to a first value which enables the buffer cell to be modeled as a wire with substantially no characteristics of a buffer, wherein further the variable may be set to a second value which enables the buffer cell to be modeled substantially as a buffer; and
    a response module to calculate different model values of the buffer cell in response to different values of the variable.

2. The apparatus of claim 1, further comprising dynamic random access memory (DRAM), a display, a data input device, and a data storage device.

3. The apparatus of claim 2, wherein the apparatus comprises a computer with electronic design automation (EDA) software.

4. The apparatus of claim 1, wherein the iteration module is arranged to vary the values of the transparency variable between zero and one, during the analysis.

5. The apparatus of claim 4, wherein the apparatus is configured to model the buffer cell as a wire when the transparency variable substantially equals zero.

6. The apparatus of claim 1, wherein the buffer cell comprises one of a a repeater and an inverter, wherein further the cell module comprises modeling information for at least one other cell.

7. The apparatus of claim 1, wherein the model values comprise at least one calculated result of slope, slope scale, slope offset, delay, delay scale, delay offset, resistance, and effective capacitance.

8. A system, comprising:
    a processor; and
    a memory device configured to store instructions which enable the system to predict timing of signals in a circuit, wherein the processor is configured to execute the instructions and calculate different model values for a cell of the circuit based on different values of a variable, wherein the processor is configured to execute the instructions to vary the values of the variable and cause the cell to be modeled with varying amounts of capacitance, wherein further the processor is configured to execute the instructions to set the variable a first value which enables the cell to be modeled substantially as a wire and to set the variable to a second value which enables the cell to be modeled substantially as a buffer.

9. The system of claim 8, wherein the processor is configured to execute the instructions to set a size value for a cell based upon the calculation of the different values of the variable.

10. The system of claim 9, wherein the processor is configured to execute the instructions to set the size value to zero to represent removal of the cell from the circuit.

11. The system of claim 8, wherein the processor is configured to execute the instructions to calculate model values for the cell, wherein further the model values comprise computing values for a slope, slope scale, slope offset, delay, delay scale, and delay offset.

12. The system of claim 11, wherein the processor is configured to execute the instructions to calculate model values for the cell using an asymptotic waveform evaluation (AWE) modeling formula.

13. The system of claim 8, wherein the processor is configured to execute the instructions to calculate model values for a buffer and an inverter.

14. The system of claim 8, wherein the processor is configured to execute the instructions to vary the value of the variable between zero and one.

* * * * *

UNITED STATES PATENT AND TRADEMARK OFFICE
CERTIFICATE OF CORRECTION

PATENT NO. : 7,840,923 B2  Page 1 of 1
APPLICATION NO. : 11/904161
DATED : November 23, 2010
INVENTOR(S) : Mccoo et al.

It is certified that error appears in the above-identified patent and that said Letters Patent is hereby corrected as shown below:

In column 12, lines 5–16, in Claim 1, delete "which enables the buffer cell to be modeled with varying amounts of capacitance based on the value of the variable, wherein further the variable may be set to a first value which enables the buffer cell to be modeled as a wire with substantially no characteristics of a buffer, wherein further the variable may be set to a second value which enables the buffer cell to be modeled substantially as a buffer; and a response module to calculate different model values of the buffer cell in response to different values of the variable." and
insert -- ; a response module that calculates different model values of the buffer cell in response to different values of the variable, wherein the different model values comprise values of delay for an output signal which corresponds to an input signal, wherein further the response module calculates the values of delay based on varying amounts of capacitance associated with varying values of the variable, wherein further the variable may be set to a first value which enables the buffer cell to be modeled as a wire with substantially no characteristics of a buffer, wherein further the variable may be set to a second value which enables the buffer cell to be modeled substantially as a buffer; and an iteration module that enables the response module to calculate the different model values. -- therefor.

In column 12, line 31, in Claim 6, after "of a" delete "a".

Signed and Sealed this
Twenty-second Day of March, 2011

David J. Kappos
*Director of the United States Patent and Trademark Office*